United States Patent
Rumsey et al.

(10) Patent No.: US 6,577,004 B1
(45) Date of Patent: Jun. 10, 2003

(54) SOLDER BALL LANDPAD DESIGN TO IMPROVE LAMINATE PERFORMANCE

(75) Inventors: Brad D. Rumsey, Meridian, ID (US); Patrick W. Tandy, Boise, ID (US); William J. Reeder, Boise, ID (US); Stephen F. Moxham, Boise, ID (US); Steven G. Thummel, Boise, ID (US); Dana A. Stoddard, Boise, ID (US); Joseph C. Young, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/653,300

(22) Filed: Aug. 31, 2000

(51) Int. Cl.⁷ .................. H01L 23/14; H01L 23/06; H01L 23/495; H01L 23/02

(52) U.S. Cl. .................. 257/738; 257/691; 257/698; 257/696; 257/692; 257/693; 257/673; 257/737; 257/784; 257/786; 257/668; 257/211; 257/208; 257/207; 228/180.1; 174/250; 174/261; 361/777; 361/760

(58) Field of Search ................ 257/738, 737, 257/734, 666, 691, 692, 693, 696, 698, 673, 676, 687, 678, 784, 786, 211, 210, 207, 700, 668; 174/250, 261; 361/777, 760, 791, 767; 439/70, 66, 75; 228/180.1; 331/1

(56) References Cited

U.S. PATENT DOCUMENTS

| | | | | |
|---|---|---|---|---|
| 5,686,764 A | * | 11/1997 | Fulcher | 257/700 |
| 5,994,766 A | * | 11/1999 | Shenoy et al. | 257/691 |
| 5,994,773 A | * | 11/1999 | Hirakawa | 257/702 |
| 6,023,096 A | * | 2/2000 | Hotta et al. | 257/687 |
| 6,122,171 A | * | 9/2000 | Akram et al. | 257/706 |
| 6,208,519 B1 | * | 3/2001 | Jiang et al. | 257/706 |
| 6,218,731 B1 | * | 4/2001 | Huang et al. | 257/738 |
| 6,228,548 B1 | * | 5/2001 | King et al. | 438/117 |
| 6,249,047 B1 | * | 6/2001 | Corisis | 257/691 |
| 6,252,298 B1 | * | 6/2001 | Lee et al. | 257/668 |
| 6,396,143 B1 | * | 5/2002 | Kimbara et al. | 257/712 |
| 2001/0020746 A1 | * | 9/2001 | Rao et al. | 257/778 |
| 2001/0052642 A1 | * | 12/2001 | Wood et al. | 257/690 |
| 2002/0000652 A1 | * | 1/2002 | Goh | 257/734 |
| 2002/0000656 A1 | * | 1/2002 | Huang et al. | 257/736 |
| 2002/0045036 A1 | * | 4/2002 | Gorrell et al. | 428/209 |

* cited by examiner

Primary Examiner—Alexander O. Williams
(74) Attorney, Agent, or Firm—Fletcher, Yoder & Van Someren

(57) ABSTRACT

A method and apparatus for improving the laminate performance of the solder balls in a BGA package. Specifically, the ball pads on the substrate are configured to increase the shear force necessary to cause delamination of the solder balls. Conductive traces extending planarly from the pads and arranged in specified configurations will increase the shear strength of the pad.

46 Claims, 7 Drawing Sheets

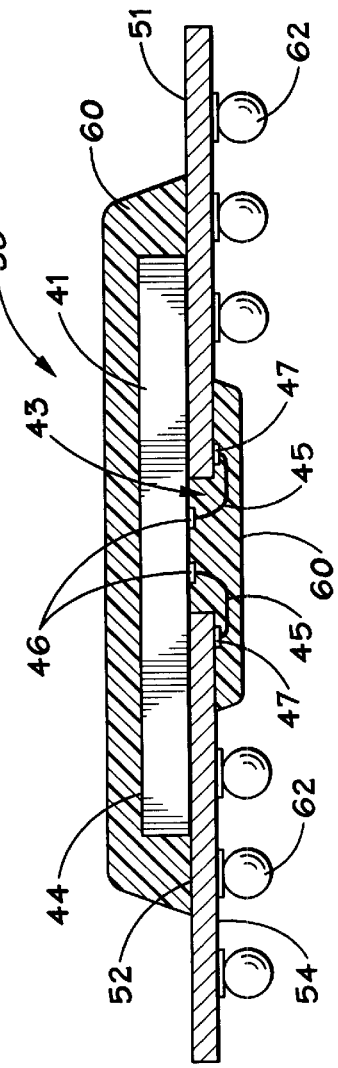
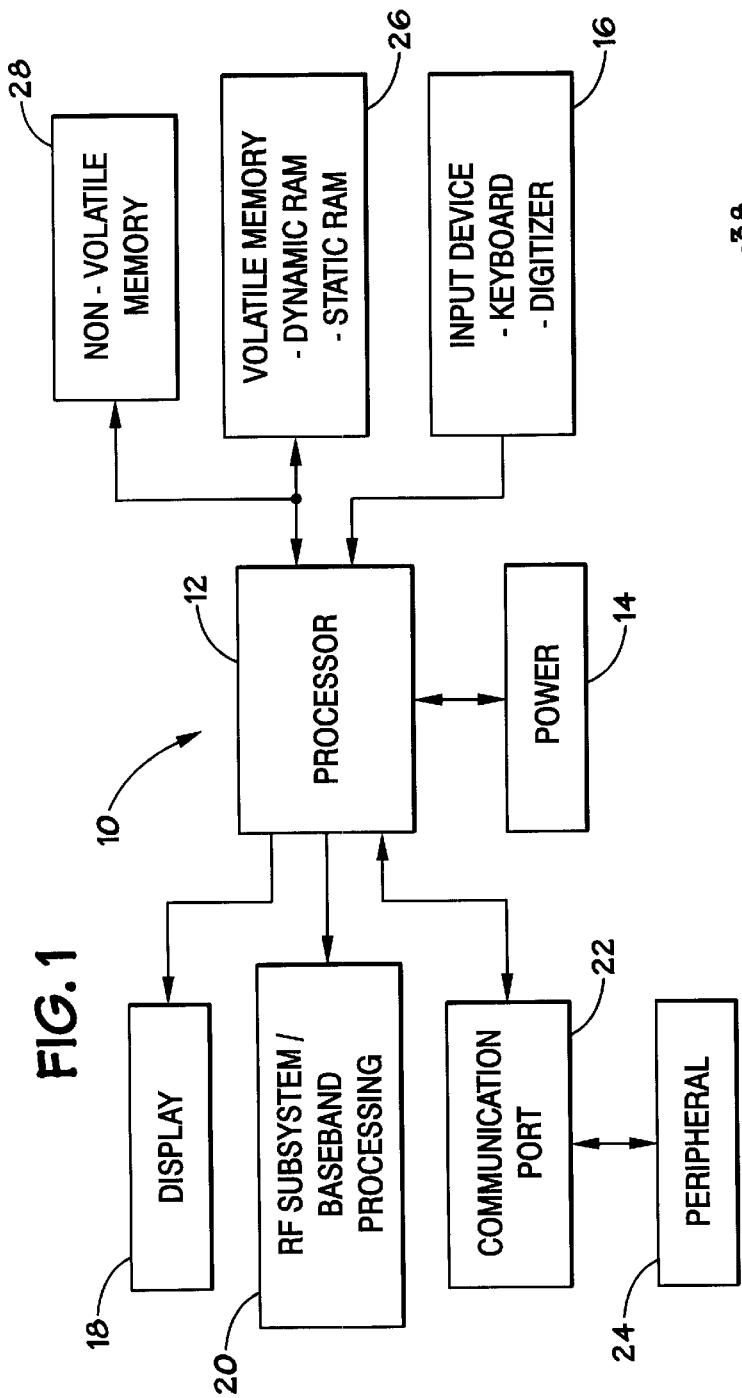
FIG. 1
FIG. 3

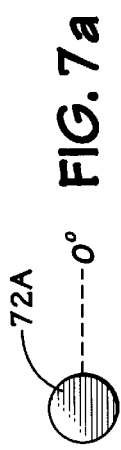
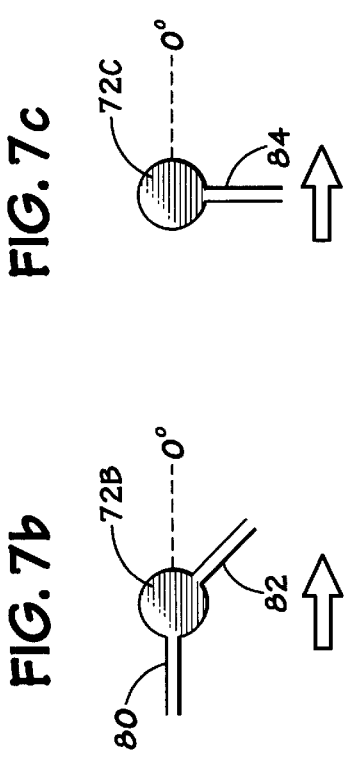
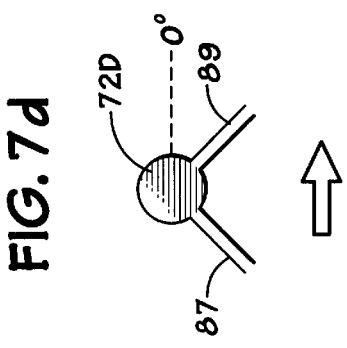
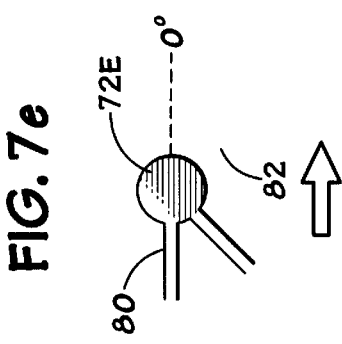
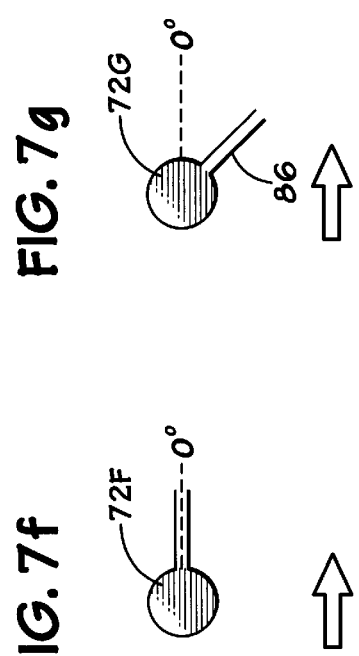
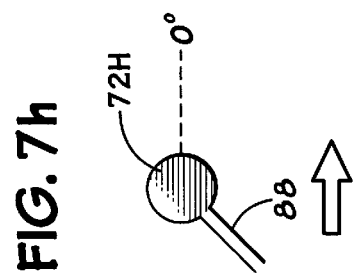
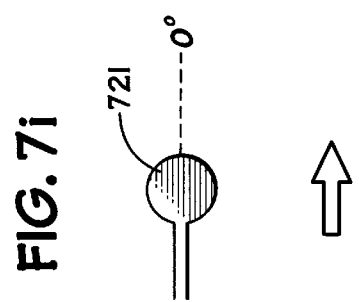

SOLDER BALL LANDPAD DESIGN TO IMPROVE LAMINATE PERFORMANCE

BACKGROUND OF THE INVENTION

1. Field of the Invention

The present invention relates generally to microelectronic packaging and, more particularly, to a method and apparatus for improving laminate performance in a ball grid array (BGA) package.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The packaging of electrical circuits is a key element in the technological development of any device containing electrical components. Several technologies have been developed to provide a means of mounting these electrical components on a surface of a substrate, such as a printed circuit board (PCB). Fine pitch surface mount (FPT), pin grid array (PGA), and ball grid array (BGA) are examples of leading surface mount technologies.

BGA technology offers several advantages over FPT and PGA. Among the most often cited advantages of BGA are: reduced co-planarity problems, since there are no leads; reduced placement problems; reduced paste printing problems; reduced handling damage; smaller size; better electrical and thermal performance; better package yield; better board assembly yield; higher interconnect density; multi-layer interconnect options; higher IO's for a given footprint; easier extension to multi-chip modules; and faster design-to-production cycle time. A BGA integrated circuit (I/C) package generally includes an I/C chip, such as a memory device, mounted on the top surface of a substrate. The I/C chip may be electrically coupled to the substrate by bond wires.

Regardless of the type of surface mount technology chosen, three common mounting techniques used to attach the I/C chip to the substrate include chip-on-board (COB), board-on-chip (BOC), and flip-chip (F/C). For COB packages, the I/C chip may be attached to the substrate "face-up". That is to say that the side of I/C chip containing the bond pads for wire bonding the chip to the substrate is left exposed on the top surface. The backside of the I/C chip, which does not contain the bond pads, is adhered to the substrate. In this type of package, bond wires are attached to the exposed surface of the chip down to pads on the top surface of the substrate. The substrate contains electrical traces which route the signals from the top side of the substrate to external connections.

Alternately, the integrated circuit die may be mounted on the substrate "face-down," as in a BOC package. In this instance, the substrate typically contains a slot. Since the I/C chip is mounted face-down, the bond pads on the surface of the chip are arranged to correlate with the slot opening in the substrate. Bond wires are attached from the bond pads on the chip, through the slot on the substrate, and to the backside of the substrate. The substrate contains electrical routing to distribute electrical signals along the backside of the substrate.

For F/C packages, the integrated circuit die is mounted on the substrate face-down as in the BOC package. However, in a F/C package bond wires are not used to electrically couple the I/C chip to the substrate. Instead, solder bumps located on the face of the chip are aligned with conductive pads on the mounting side of the substrate. The solder bumps may be re-flowed to electrically couple the chip to the substrate. The substrate contains electrical routing to distribute the electrical signals from the die along the backside of the substrate.

Regardless of the mounting techniques used to attach an I/C chip to a substrate, BGA substrates contain conductive routing which allows the signals to pass from the I/C chip to landpads on the backside of the substrate. A plurality of solder balls are deposited and electrically coupled to the landpads on the backside of the substrate to be used as input/output terminals for electrically connecting the substrate to a PCB or other external device.

The substrate is generally a laminate made up of many layers of thin material. Because the substrate is comprised of several layers of material which have been bonded together, the integrity between layers of material may provide a failure mechanism in the I/C package. Solder ball-to-landpad or landpad-to-substrate integrity, which may be critical to the functionality of the I/C package, are particularly susceptible to delamination due to mechanical stresses associated with handling and shipping of the I/C packages. This is especially true when the part is processed through electrical testing, since the packages are frequently being loaded and unloaded in and out of test sockets. Cratering, pad lifting, and ball shearing are typical failure modes which are associated with laminates.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a system comprising a processor and an integrated circuit package. The integrated circuit package is operatively coupled to the processor, the integrated circuit package comprising an integrated circuit die coupled to a substrate, the substrate comprising a first surface and a second surface, the second surface having a plurality of pads, each pad having one or more conductive traces extending on the second surface therefrom and configured to increase the shear strength of the pad as compared to the pad alone.

In another embodiment of the present invention, there is provided an integrated circuit package comprising an integrated circuit die and a substrate coupled to the integrated circuit die and comprising a first surface and a second surface, the second surface having a plurality of pads, each pad having one or more conductive traces on the second surface extending therefrom and configured to increase the shear strength of the pad as compared to the pad alone.

In yet another embodiment of the present invention, there is provided a substrate comprising a first surface and a second surface, the second surface having a plurality of pads, each pad having one or more conductive traces on the second surface extending therefrom and configured to increase the shear strength of the pad as compared to the pad alone.

In still another embodiment of the present invention, there is provided a method of building an integrated circuit package comprising the acts of: providing a substrate having a first surface and a second surface, the second surface having a plurality of pads, each pad having one or more conductive traces on the second surface extending therefrom and configured to increase the shear strength of the pad as compared to the pad alone; and disposing an integrated circuit die onto the substrate.

In still another embodiment of the present invention, there is provided a system comprising a processor and an integrated circuit package. The integrated circuit package is operatively coupled to the processor, the integrated circuit package comprising an integrated circuit die coupled to a substrate, each substrate comprising a first surface and a second surface, the second surface having an array of landpads, the array comprising four corner landpads, each of the four corner landpads having one or more conductive traces extending planarly therefrom and configured to increase the shear strength of the pad.

In still a further embodiment of the present invention, there is provided an integrated circuit package comprising an integrated circuit die and a substrate coupled to the integrated circuit die and comprising a first surface and a second surface, the second surface having an array of landpads, the array comprising four corner landpads, each of the four corner landpads having one or more conductive traces extending planarly therefrom and configured to increase the shear strength of the pad.

In yet a further embodiment of the present invention, there is provided a substrate comprising a first surface and a second surface, the second surface having an array of landpads, the array comprising four corner landpads, each of the four corner landpads having one or more conductive traces extending planarly therefrom and configured to increase the shear strength of the pad.

In yet another embodiment of the present invention, there is provided a substrate comprising a first surface and a second surface, the second surface having an array of landpads and four out-rigger pads, each of the out-rigger pads having one or more conductive traces extending planarly therefrom and configured to increase the shear strength of the pad.

In still a further embodiment of the present invention, there is provided a method of manufacturing an integrated circuit package comprising the acts of: manufacturing a plurality of BGA substrates comprising a plurality of landpads and a plurality of solderballs; testing the substrates for failure mechanisms associated with a dislodging of the solderballs; and; re-designing the substrates such that the landpads exhibiting the failure mechanisms are configured to increase the shear strength of the landpad.

In still another further embodiment of the present invention, there is provided a method of building an integrated circuit package comprising the acts of: providing a substrate comprising a first surface and a second surface, the second surface having an array of landpads, the array comprising four corner landpads, each of the four corner landpads having one or more conductive traces extending planarly therefrom and configured to increase the shear strength of the pad; and disposing an integrated circuit die onto the substrate.

BRIEF DESCRIPTION OF THE DRAWINGS

The foregoing and other advantages and features of the invention will become apparent upon reading the following detailed description and upon reference to the drawings in which:

FIG. 1 illustrates a block diagram of an exemplary processor-based device in accordance with the present invention;

FIG. 3 illustrates a cross sectional view of an exemplary BOC package;

FIGS. 7A–7I illustrate alternate embodiments of landpad configurations in accordance with the present invention;

DETAILED DESCRIPTION OF SPECIFIC EMBODIMENTS

Figure 2:
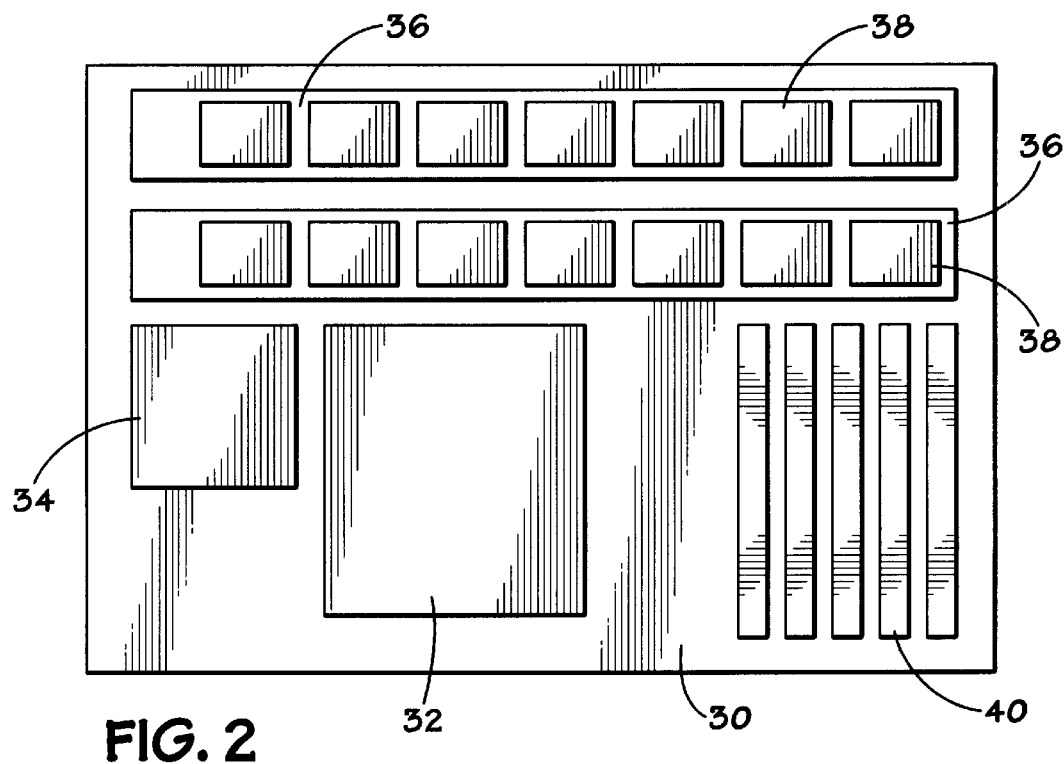
FIG. 2 illustrates a plan view of a circuit board having various devices employed thereon.

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a signal processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10, generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

Referring to FIG. 2, a circuit board 30, such as a printed circuit board (PCB), is shown having various devices and connections coupled to its surface. A microprocessor 32 is shown along with a ROM device 34 and a set of memory modules 36, each containing a plurality of RAM chips 38. A plurality of connections or ports 40 are also located on the circuit board 30 allowing for connection to various peripheral devices and expansion modules. In a computer application, for example, such peripheral devices and expansion modules might include sound cards, video cards, additional memory modules, or connections for input and output peripherals. While the present embodiment has a direct relation to memory chips such as the ROM device 34 and RAM chip 38, the invention as described below herein, may be applied to any device package having similar mounting characteristics including, if desired, the microprocessor 32.

Referring to FIG. 3, a RAM device 38 is depicted as a typical BGA device in this example. For illustrative purposes, a BOC package is shown. However, it should be understood that the present invention may be used in any BGA or FBGA device, including COB and F/C packages. The device 38 typically includes an I/C die 41, such as a memory die. Normally, the die 41 is attached to a substrate 51 by an adhesive such as tape (not shown) and electrically coupled to the substrate 51 by bond wires 45.

In this embodiment, the die 41 may be mounted with the first surface 42 of the I/C die 41 placed in contact with the first surface 52 of the substrate 51. In this example, a slot 43 is formed in the substrate 51, and bond pads 46 on the first surface 42 of the die 41 are aligned with the slot 43. This alignment allows bond wires 45 to be attached to bond pads 46 on the first surface 42 of the die 41 and to bond pads 47 on the second surface 54 of the substrate 51. During the encapsulation process, molding compound 60 may be disposed on the second surface 44 of the die 41, which is not in contact with the substrate 50, and on the first surface 52 of the substrate 51. The molding compound 60 may be disposed through the slot 43 in the substrate 51 and on a portion of the second surface 54 of the substrate 51 to protect the I/C die 41 and the bond wires 45 from external elements such as moisture, particles and physical contact. The molding compound 60 which is deposited on the second surface 54 of the substrate 51 may also be configured to cover a larger portion of the second surface 54 of the substrate 51 to further protect the device 38 and substrate 51.

Figure 4A:
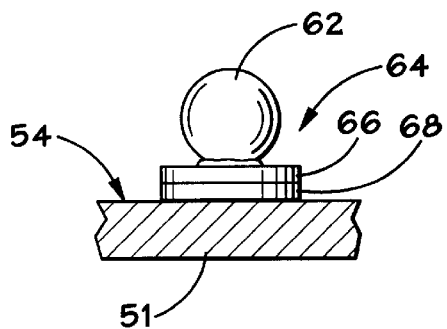
FIGS. 4A–4D illustrate typical failure modes of a BGA package.

Landpads 64 located on the second surface 54 of the substrate 51 provide locations for solder ball 62 attachment to facilitate electrical coupling of the device 38 to a PCB or other external device. A solder ball 62 is generally attached to the landpads 64 on the substrate 51, as better illustrated in FIG. 4A. For the sake of clarity, elements similar to those elements previously described will be designated by like reference numerals. The landpads 64 are located on the second surface 54 of the substrate 51 in this embodiment. The landpads 64 generally include one or more layers of conductive metal, such as gold (Au) 66 and/or nickel (Ni) 68 for example, although any suitable conductive material or combination of conductive materials may be used. The landpads 64 are electrically coupled to conductive traces in the substrate 51 and further coupled to an I/C die 41 (illustrated in FIG. 3). Solder balls 62 may then be disposed onto the landpads 64. The solder balls 62 are attached to the landpads 64 by reflowing the solder balls 62 to promote adhesion to the metallic landpads 64.

Figure 4B:
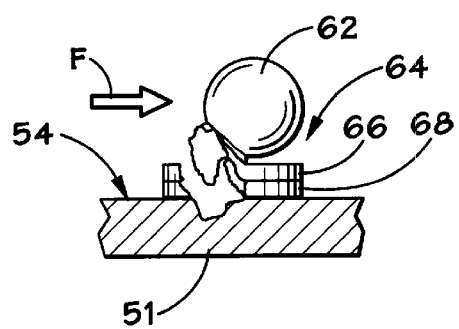
Figure 4C:
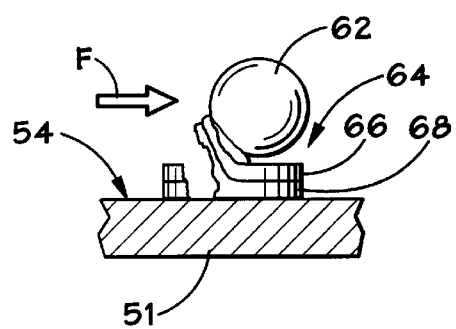
Figure 4D:
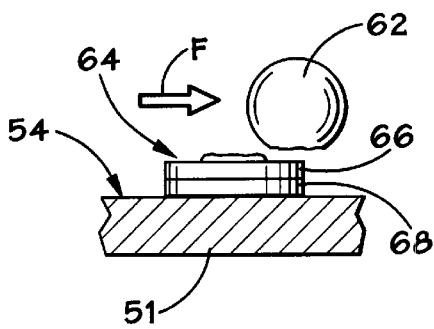

The solder ball 62 is often exposed to mechanical forces during processing, testing and shipping of the I/C package 38. The solder ball 62 may experience forces as illustrated in FIGS. 4B–4D, which may result in delamination of the solder ball 62. When a force, moving in the direction of force arrow F is applied to the solder ball 62, several failure modes may result. FIG. 4B illustrates a cratering effect. As force F is applied to the solder ball 62, the Au 66 and Ni 68 layers are pulled away from the substrate 51. Oftentimes, the Au 66 and Ni 68 layers lift part of the substrate material, thus resulting in a crater in the substrate 51. FIG. 4C illustrates lifting of the landpad 64. Here, when the force F is applied to the solder ball 62, the Au 66 and Ni 68 layers peel away from the substrate 51. Thus, the landpad 64 is essentially lifted away from the substrate 51 by the removal of the solder ball 62. FIG. 4D illustrates a failure mode known as ball shear. Here the solder ball 62 is simply sheared off of the landpad 64, thus leaving the landpad 64 intact. Regardless of the failure mode, removal of the solder ball 62 will disadvantageously result in a failure of RAM device 38.

Figure 5:
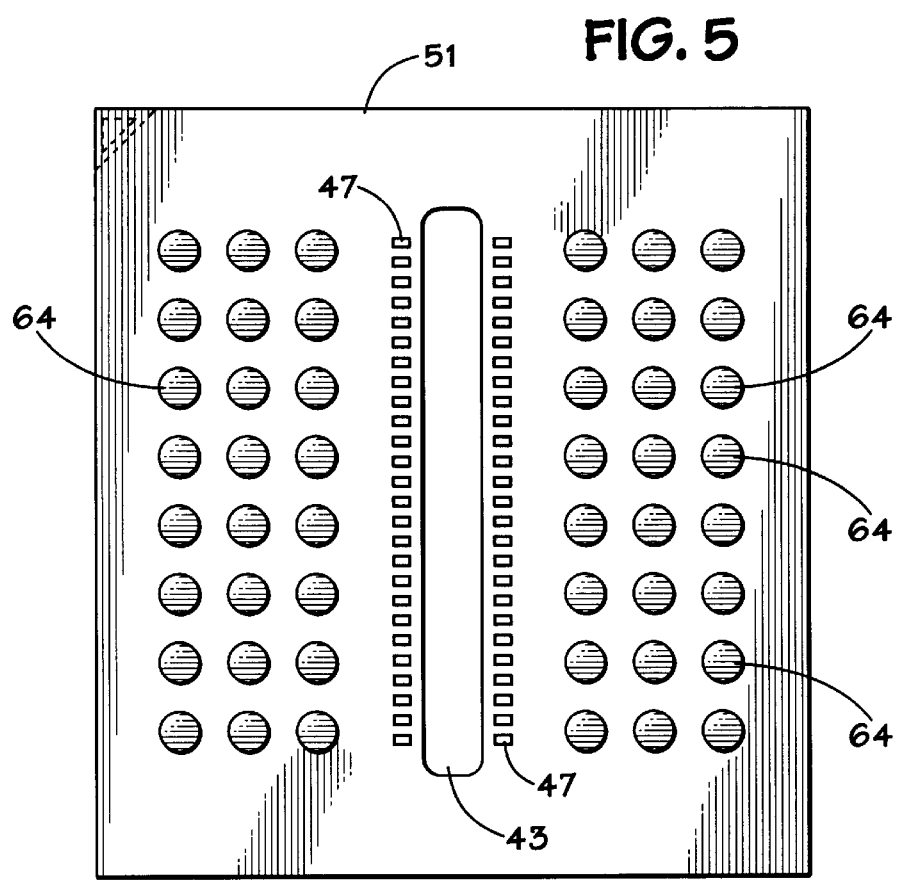
FIG. 5 illustrates a backside view of an exemplary BGA substrate.

Generally, the second surface 54 of a substrate 51 may be configured as illustrated in FIG. 5. Bond pads 47 may be disposed along the slot 43 to provide for attachment of bond wires from the bond pads 47 through the slot 43 and to bond pads on an I/C die (shown in FIG. 3). The bond pads 47 are also electrically connected to the landpads 64 by conductive traces (illustrated in FIG. 6) contained within the substrate 51. The conductive traces are exposed throughout the substrate 51 on several layers and connected by vias. The landpads 64 are electrically coupled to the conductive traces by vias which are present under the landpads 64. Disadvantageously, this substrate 51 design often results in the failures discussed with reference to FIGS. 4B–4D since the solder balls (illustrated in FIG. 3) may experience mechanical forces (as illustrated in FIGS. 4B–4D).

Figure 6:
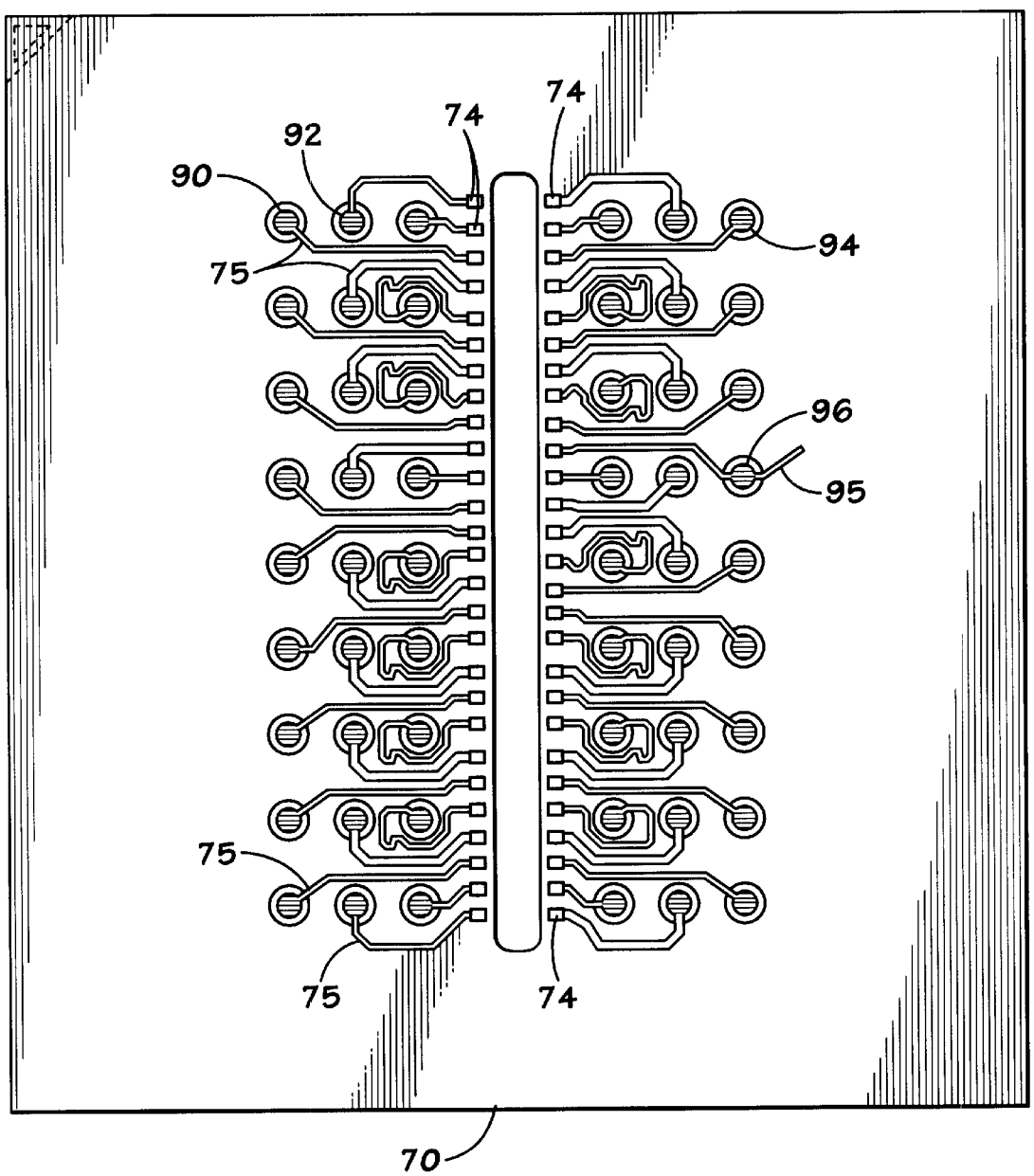
FIG. 6 illustrates one embodiment of a BGA substrate in accordance with the present invention.

Advantageously, the present embodiment mitigates the failure modes discussed in FIGS. 4B–4D. One exemplary embodiment of the substrate 70 is illustrated in FIG. 6. Through reliability testing and experimentation, it has been determined that certain conductive trace configurations on the surface of the substrate 70 make the solder ball attachment more resistant to the failure modes previously discussed. The existence of conductive traces 75 which are planarly coupled to the landpads helps to counterpose shearing forces which may be applied to the I/C package. If a shear force direction can be predicted, the substrate 70 may be configured in such a way as to counterpose the shearing force. The metal traces which extend from the landpads may be those electrically coupled to the bond pads 74, as illustrated in FIG. 6, or they may simply be conductive traces which are not electrically terminated at a bond pad 74 but which provide resistance to shear forces as illustrated by trace 95. FIG. 6 can be better understood with reference to FIGS. 7A–7I and FIG. 8.

Figure 8:
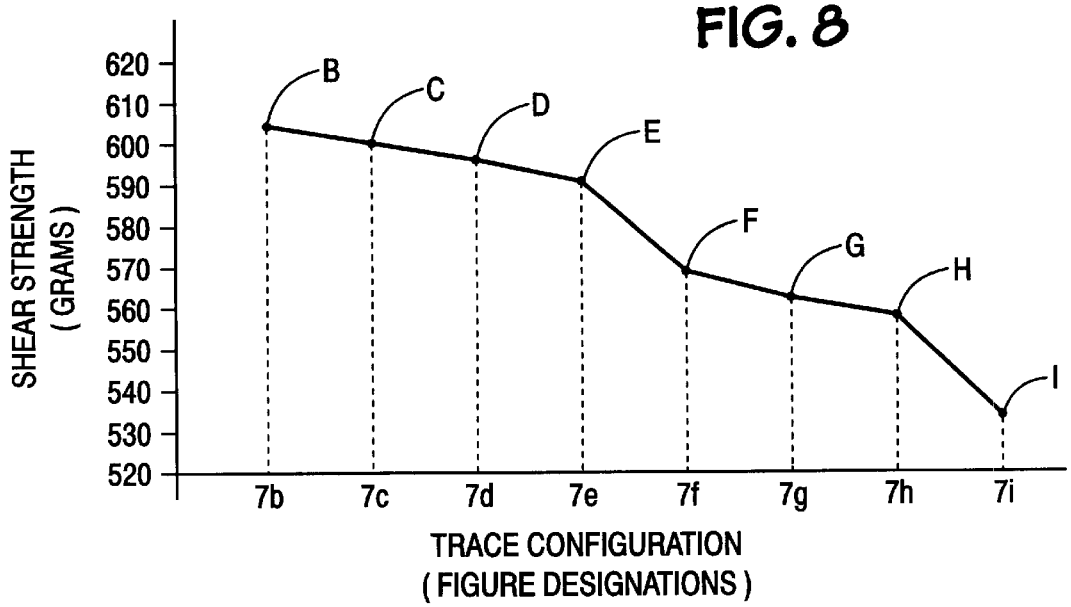
FIG. 8 illustrates a graph depicting the average shear strength of various landpad configurations in accordance with the present invention.

FIGS. 7A–7I and FIG. 8 further illustrate the present embodiment, and FIGS. 7B–7I should be viewed in conjunction with FIG. 8 and Table 1. Table 1 set forth below contains sample test data to better illustrate the embodiment.

configuration is not discussed in detail. However, it should be understood that the embodiments illustrated in FIGS. 7B–7I and the related data illustrated in FIG. 8 and Table 1 describe different embodiments of the invention. Further references can be made by examining the correlation between FIGS. 7B–7I, FIG. 8, and Table 1.

Incorporation of the embodiments illustrated in FIGS. 7B–7I can be further described with reference to FIG. 6. Landpad 90, for instance, incorporates the embodiment illustrated in FIG. 7G, which is a landpad 72G with a 315° trace 86 extending therefrom. Landpad 92 illustrates the embodiment shown in FIG. 7C, which is a landpad 72C with a trace 84 extending therefrom at 270°. Note that landpad 92 is actually the mirror image taken along a line parallel to the force vector F, of the embodiment illustrated in FIG. 7C. The shear strength will be approximately the same for figures taken about a mirror image along a line extending through

TABLE 1

| I<br>FIG. | II<br>Trace<br>Configuration | III<br>832 BS | IV<br>832 HS | V<br>TLC-W-556 | VI<br>832 | VII<br>E679 | VIII<br>MEGTRON | IX<br>Average |
|---|---|---|---|---|---|---|---|---|
| 7B | 180°/315° | 606.0 | 612.4 | 604.5 | 595.0 | 596.4 | 611.6 | 604.3 |
| 7C | 270° | 602.5 | 606.5 | 596.8 | 608.4 | 591.7 | 588.6 | 599.1 |
| 7D | 225°/315° | 587.8 | 601.5 | 588.0 | 605.8 | 589.6 | 595.6 | 594.7 |
| 7E | 180°/225° | 601.4 | 606.4 | 579.3 | 591.1 | 590.5 | 575.3 | 590.7 |
| 7F | 0° | 571.6 | 569.2 | 573.1 | 563.9 | 571.7 | 563.3 | 568.8 |
| 7G | 315° | 574.5 | 560.0 | 569.8 | 538.8 | 563.5 | 566.3 | 562.1 |
| 7H | 225° | 566.7 | 565.0 | 554.4 | 578.3 | 543.5 | 535.6 | 557.3 |
| 7I | 180° | 541.5 | 537.8 | 532.7 | 545.2 | 519.8 | 517.4 | 532.4 |

FIGS. 7A–7I illustrate landpads 72 with alternate configurations of metal traces extending therefrom. FIG. 7A illustrates a landpad 72A with no metal traces extending therefrom. All trace directions corresponding to Table 1 are referenced counter-clockwise from a circle whose starting angle of 0° is illustrated by the dashed line shown in FIGS. 7A–7I.

The trace configuration illustrated in FIG. 7B contains two traces extending from the landpad 72B. Trace 80 is located at 180°, while trace 82 is located at 315°. Referring to the first row of data in Table 1, the landpad configuration illustrated in FIG. 7B is shown. Data was taken for six different laminate materials (832 BS, 832 HS, TLC-W-556, 832, E679 and MEGTRON) which may be used for the substrate. Regardless of the laminate material, the test data is consistent in that it illustrates that certain landpad/trace configurations provided more shear strength and thus, more resistance to solder ball delamination. Thus, the shear strength for this particular configuration using laminate 832 BS is 606.0 grams, as illustrated in Table 1. That is to say that with this particular configuration, it takes 606.0 grams of force to dislodge the solder ball from the substrate 51. Each substrate material was tested and the average for each trace configuration is shown in column IX. Thus, the average shear strength of configuration 7B is 604.3 grams. A plot of the average shear strength of each configuration (FIGS. 7B–7I) is illustrated in FIG. 8. Again referring to the configuration illustrated in FIG. 7B, the shear strength of 604.3 grams is plotted as the first data point B.

FIG. 7C illustrates the configuration with the second best result. As can be seen in FIG. 7C, this configuration has a single trace 84 extending from the landpad 72C at 270°. Referring again to Table 1, the average shear strength of this configuration is 599.1 grams, as illustrated in column 9. This data point C is plotted in FIG. 8. For simplicity, each the landpad and parallel to the force F. Thus, a trace extending at 90° from zero, as in landpad 92, or 270° from zero, as in FIG. 7C, will have essentially the same shear strength. This holds true only for a mirror image taken along the line extending through the landpad and parallel to the direction of the force F. One point that may be noteable is in regard to landpads such as those illustrated in FIG. 7F and FIG. 7I. Because the traces extending from the landpads run parallel to the direction of the force, a different shear strength will result from the placement of a trace along the 0° line, as in FIG. 7F and along the 180° line as in FIG. 7I.

Landpad 94 incorporates the embodiment illustrated in FIG. 7H, which is a landpad 72H with a trace 88 extending at 225°. This landpad design will have an average shear strength of 557.3 grams. Landpad 96 corresponds with the mirror image taken along the line parallel to the direction of the force F in FIG. 7D. FIG. 7D illustrates a landpad 72D with traces 87 and 89 extending therefrom at 225° and 315°, respectively. Landpad 96 is the mirror image of the embodiment illustrated in FIG. 7D with traces extending therefrom at 45° and 135°. The shear strength of the landpad 96 will be approximately equal to that of the landpad 72D in FIG. 7D, which has an average shear strength of 594.7 grams.

Figure 9:
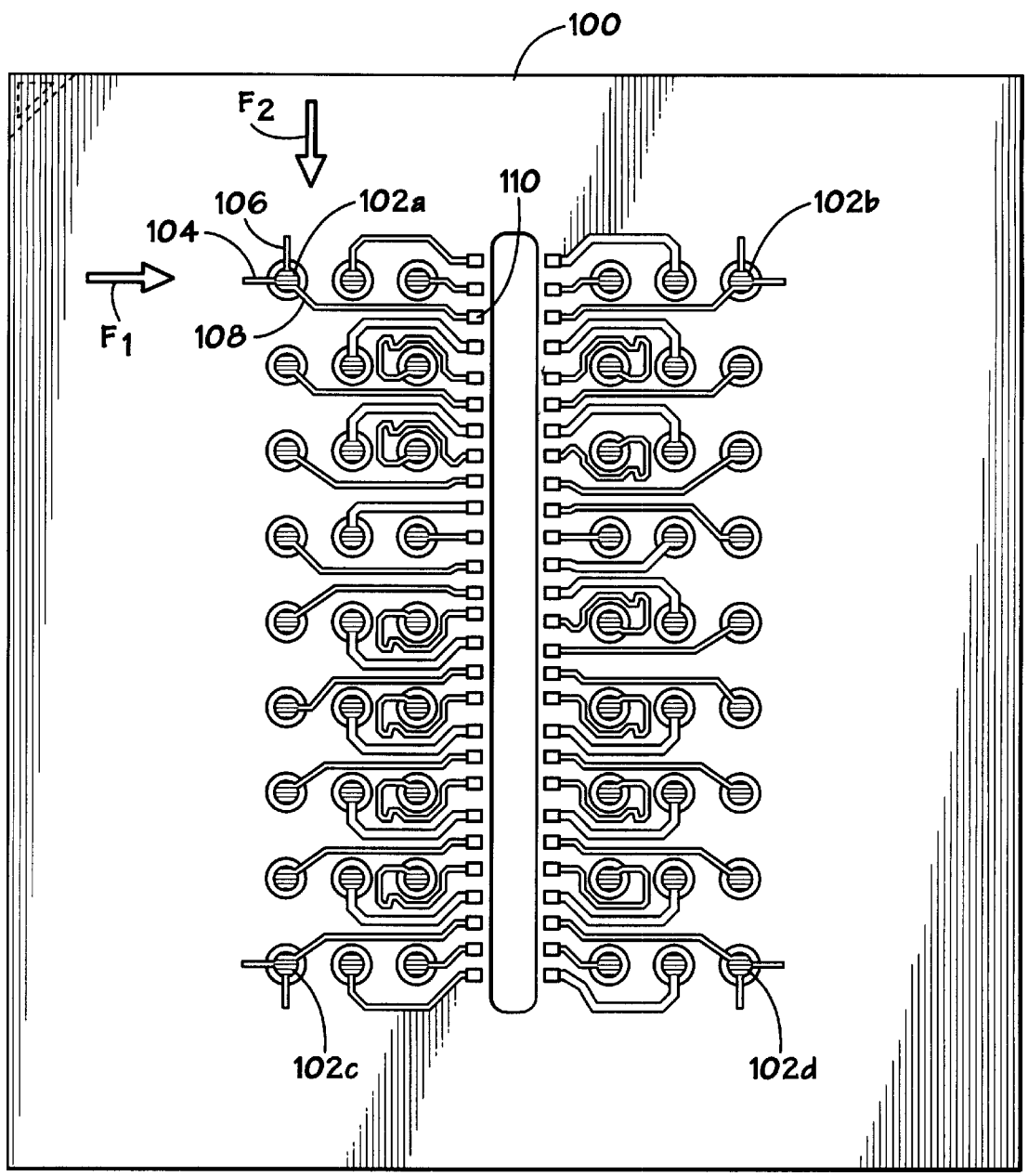
FIG. 9 illustrates an alternative embodiment of a BGA substrate in accordance with the present invention.

One area of a BGA substrate which is particularly susceptible to shear forces is each corner landpad in the BGA array. In one embodiment it may be advantageous to design a substrate such that the landpads located in each corner of the array are optimized to resist shear forces which are likely to be experienced during manufacturing and shipping of the BGA substrate. FIG. 9 illustrates a BGA substrate 100. Landpads 102a, 102b, 102c, and 102d are configured such that they resist the failure mechanisms discussed with reference to FIG. 4. Landpad 102a, for instance, is configured with terminated traces 104 and 106 as well as trace 108 which extends to a bond pad 110. The landpad 102a is likely to experience forces F1 and F2 during shipping and manufacturing. The configuration of the landpad 102*a* and the traces 104, 106, and 108 provide an optimal resistance to the forces F1 and F2. The trace configuration of landpads 102*a*–102*d* is representative of the trace configuration illustrated in FIG. 7B which will have an optimized shear strength against a force F1 or F2. This shear strength is illustrated by point B in FIG. 8. Because the corner locations of the BGA array are most susceptible to shear forces, each of the corner landpads 102*a*, 102*b*, 102*c*, and 102*d* are configured to optimally resist likely shear forces.

Figure 10:
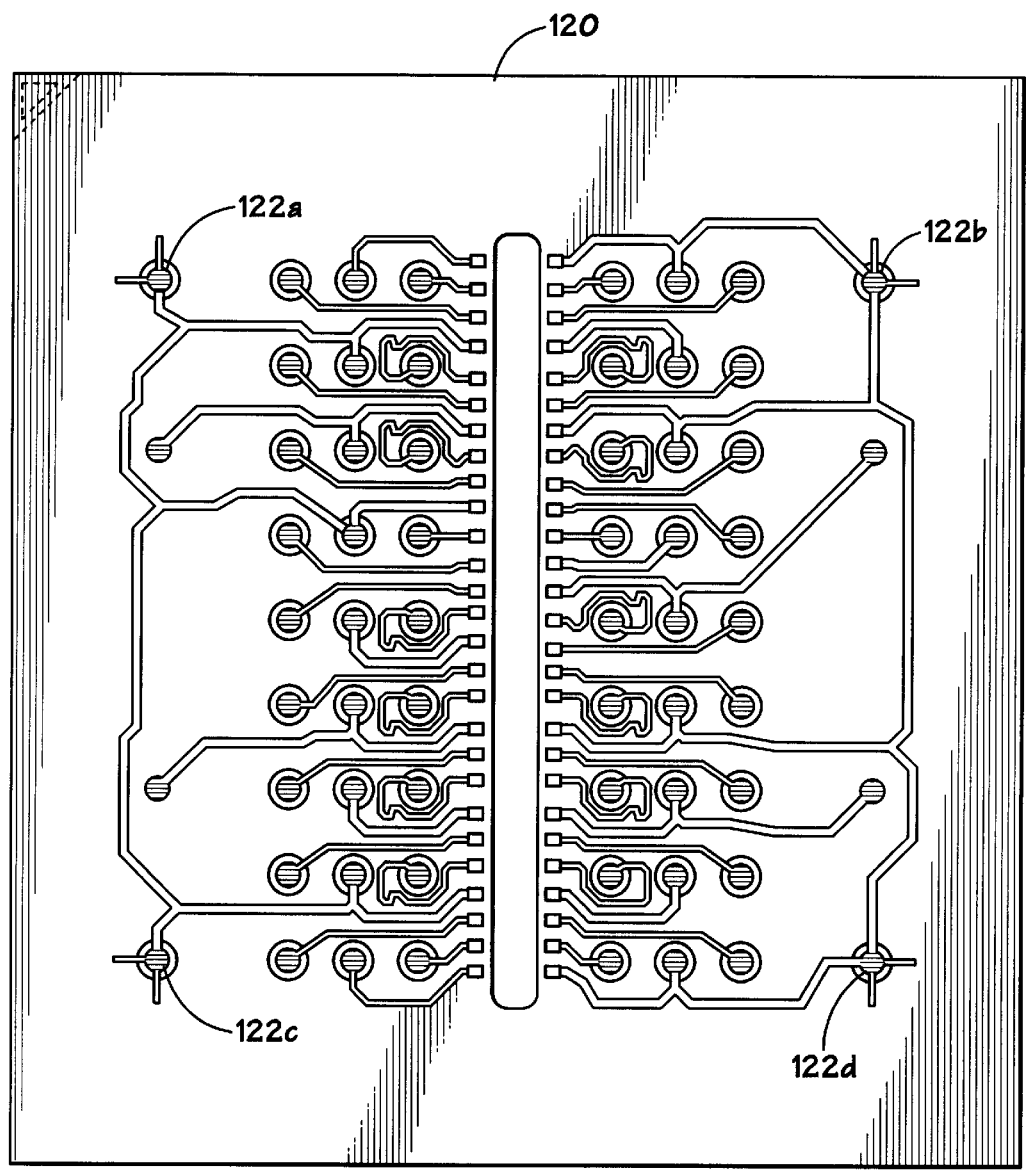
FIG. 10 illustrates an alternative embodiment of a BGA substrate incorporating out-rigger ball pads in accordance with the present invention.

FIG. 10 illustrates an alternate embodiment of the present technique. The substrate 120 comprises a typical landpad ball grid array. Often times, aside from the landpad array, "out-rigger" ball pads are disposed as illustrated by pads 122*a*, 122*b*, 122*c*, and 122*d* in FIG. 10. The out-rigger pads 122*a*–122*d* are used to help keep the BGA device planer once it is mounted onto a larger substrate or PCB. By providing out-rigger balls, this substrate 120 may be prevented from rocking on the center ball array. The present technique of adding traces to the landpads to provide a resistance to shear forces may also be applicable for out-rigger ball pads such as those illustrated in FIG. 10. Here, ball pads 122*a*–122*d* have been configured like landpads 102*a*–102*d* illustrated in FIG. 9 and again corresponding to the configuration illustrated in FIG. 7B which will provide an optimal resistance to shear forces which may be experienced during manufacturing or shipping of the substrate 120.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An integrated circuit package comprising:
   an integrated circuit die; and
   a substrate coupled to the integrated circuit die and comprising a first surface and a second surface, the second surface having a plurality of pads, each pad having one or more conductive traces on the second surface extending therefrom and configured to increase the shear strength of the pad as compared to the pad alone.

2. The package, as set forth in claim 1, wherein the integrated circuit die comprises a memory die.

3. The package, as set forth in claim 1, wherein the substrate comprises a slot.

4. The package, as set forth in claim 1, wherein the integrated circuit die is mounted on the substrate in a board-on-chip fashion.

5. The package, as set forth in claim 1, wherein the second surface of the substrate comprises one or more pads having a first conductive trace extending therefrom at an angle of approximately 180° relative to the direction of a force which may be applied to a solderball disposed on the one or more pads and a second conductive trace extending therefrom at an angle of approximately 315° relative to the direction of a force which may be applied to a solderball disposed on the one or more pads.

6. The package, as set forth in claim 1, wherein the second surface of the substrate comprises one or more pads having a conductive trace extending therefrom at an angle of approximately 270° relative to the direction of a force which may be applied to a solderball disposed on the one or more pads.

7. The package, as set forth in claim 1, wherein the second surface of the substrate comprises one or more pads having a first conductive trace extending therefrom at an angle of approximately 225° relative to the direction of a force which may be applied to a solderball disposed on the one or more pads and a second conductive trace extending therefrom at an angle of approximately 315° relative to the direction of a force which may be applied to a solderball disposed on the one or more pads.

8. The package, as set forth in claim 1, wherein the second surface of the substrate comprises one or more pads having a first conductive trace extending therefrom at an angle of approximately 180° relative to the direction of a force which may be applied to a solderball disposed on the one or more pads and a second conductive trace extending an angle of approximately 225° relative to the direction of a force which may be applied to a solderball disposed on the one or more pads.

9. The package, as set forth in claim 1, wherein the second surface of the substrate comprises one or more pads having a conductive trace extending therefrom at an angle of approximately 0° relative to the direction of a force which may be applied to a solderball disposed on the one or more pads.

10. The package, as set forth in claim 1, wherein the second surface of the substrate comprises one or more pads having a conductive trace extending therefrom at an angle of approximately 315° relative to the direction of a force which may be applied to a solderball disposed on the one or more pads.

11. The package, as set forth in claim 1, wherein the second surface of the substrate comprises one or more pads having a conductive trace extending therefrom at an angle of approximately 225° relative to the direction of a force which may be applied to a solderball disposed on the one or more pads.

12. The package, as set forth in claim 1, wherein the second surface of the substrate comprises one or more pads having a conductive trace extending therefrom at an angle of approximately 180° relative to the direction of a force which may be applied to a solderball disposed on the one or more pads.

13. The package, as set forth in claim 1, wherein the second surface of the substrate comprises one or more pads having one of:
   a first conductive trace extending therefrom at an angle of approximately 180° relative to the direction of a force which may be applied to a solderball disposed on the one or more pads and a second conductive trace extending therefrom at an angle of approximately 315° relative to the direction of a force which may be applied to a solderball disposed on the one or more pads;
   a conductive trace extending therefrom at an angle of approximately 270° relative to the direction of a force which may be applied to a solderball disposed on the one or more pads;
   a first conductive trace extending therefrom at an angle of approximately 225° relative to the direction of a force which may be applied to a solderball disposed on the one or more pads and a second conductive trace extending therefrom at an angle of approximately 315° relative to the direction of a force which may be applied to a solderball disposed on the one or more pads;
   a first conductive trace extending therefrom at an angle of approximately 180° relative to the direction of a force which may be applied to a solderball disposed on the one or more pads and a second conductive trace extending an angle of approximately 225° relative to the direction of a force which may be applied to a solderball disposed on the one or more pads;

a conductive trace extending therefrom at an angle of approximately 0° relative to the direction of a force which may be applied to a solderball disposed on the one or more pads;

a conductive trace extending therefrom at an angle of approximately 315° relative to the direction of a force which may be applied to a solderball disposed on the one or more pads;

a conductive trace extending therefrom at an angle of approximately 225° relative to the direction of a force which may be applied to a solderball disposed on the one or more pads; and a conductive trace extending therefrom at an angle of approximately 180° relative to the direction of a force which may be applied to a solderball disposed on the one or more pads.

14. A substrate comprising a first surface and a second surface, the second surface having a plurality of pads, each pad having one or more conductive traces on the second surface extending therefrom and configured to increase the shear strength of the pad as compared to the pad alone.

15. The substrate, as set forth in claim 14, wherein the second surface of the substrate comprises one or more pads having a first conductive trace extending therefrom at an angle of approximately 180° relative to the direction of a force which may be applied to a solderball disposed on the one or more pads and a second conductive trace extending therefrom at an angle of approximately 315° relative to the direction of a force which may be applied to a solderball disposed on the one or more pads.

16. The substrate, as set forth in claim 14, wherein the second surface of the substrate comprises one or more pads having a conductive trace extending therefrom at an angle of approximately 270° relative to the direction of a force which may be applied to a solderball disposed on the one or more pads.

17. The substrate, as set forth in claim 14, wherein the second surface of the substrate comprises one or more pads having a first conductive trace extending therefrom at an angle of approximately 225° relative to the direction of a force which may be applied to a solderball disposed on the one or more pads and a second conductive trace extending therefrom at an angle of approximately 315° relative to the direction of a force which may be applied to a solderball disposed on the one or more pads.

18. The substrate, as set forth in claim 14, wherein the second surface of the substrate comprises one or more pads having a first conductive trace extending therefrom at an angle of approximately 180° relative to the direction of a force which may be applied to a solderball disposed on the one or more pads and a second conductive trace extending an angle of approximately 225° relative to the direction of a force which may be applied to a solderball disposed on the one or more pads.

19. The substrate, as set forth in claim 14, wherein the second surface of the substrate comprises one or more pads having a conductive trace extending therefrom at an angle of approximately 0° relative to the direction of a force which may be applied to a solderball disposed on the one or more pads.

20. The substrate, as set forth in claim 14, wherein the second surface of the substrate comprises one or more pads having a conductive trace extending therefrom at an angle of approximately 315° relative to the direction of a force which may be applied to a solderball disposed on the one or more pads.

21. The substrate, as set forth in claim 14, wherein the second surface of the substrate comprises one or more pads having a conductive trace extending therefrom at an angle of approximately 225° relative to the direction of a force which may be applied to a solderball disposed on the one or more pads.

22. The substrate, as set forth in claim 14, wherein the second surface of the substrate comprises one or more pads having a conductive trace extending therefrom at an angle of approximately 180° relative to the direction of a force which may be applied to a solderball disposed on the one or more pads.

23. The substrate, as set forth in claim 14, wherein the second surface of the substrate comprises one or more pads having one of:

a first conductive trace extending therefrom at an angle of approximately 180° relative to the direction of a force which may be applied to a solderball disposed on the one or more pads and a second conductive trace extending therefrom at an angle of approximately 315° relative to the direction of a force which may be applied to a solderball disposed on the one or more pads;

a conductive trace extending therefrom at an angle of approximately 270° relative to the direction of a force which may be applied to a solderball disposed on the one or more pads;

a first conductive trace extending therefrom at an angle of approximately 225° relative to the direction of a force which may be applied to a solderball disposed on the one or more pads and a second conductive trace extending therefrom at an angle of approximately 315° relative to the direction of a force which may be applied to a solderball disposed on the one or more pads;

a first conductive trace extending therefrom at an angle of approximately 180° relative to the direction of a force which may be applied to a solderball disposed on the one or more pads and a second conductive trace extending an angle of approximately 225° relative to the direction of a force which may be applied to a solderball disposed on the one or more pads;

a conductive trace extending therefrom at an angle of approximately 0° relative to the direction of a force which may be applied to a solderball disposed on the one or more pads;

a conductive trace extending therefrom at an angle of approximately 315° relative to the direction of a force which may be applied to a solderball disposed on the one or more pads;

a conductive trace extending therefrom at an angle of approximately 225° relative to the direction of a force which may be applied to a solderball disposed on the one or more pads; and a conductive trace extending therefrom at an angle of approximately 180° relative to the direction of a force which may be applied to a solderball disposed on the one or more pads.

24. An integrated circuit package comprising:

an integrated circuit die; and a substrate coupled to the integrated circuit die and comprising a first surface and a second surface, the second surface having an array of landpads, the array comprising four corner landpads, each of the four corner landpads having one or more conductive traces extending planarly therefrom and configured to increase the shear strength of the pad.

25. The integrated circuit die, as set forth in claim 24, wherein the integrated circuit die comprises a memory die.

26. The integrated circuit die, as set forth in claim 24, wherein the substrate comprises a slot.

27. The integrated circuit die, as set forth in claim 24, wherein the integrated circuit die is mounted on the substrate in a board-on-chip fashion.

28. The integrated circuit die, as set forth in claim 24, wherein the second surface of the substrate comprises four corner landpads, each corner landpad having a conductive trace extending therefrom at an angle of approximately 180° and a conductive trace extending therefrom at an angle of approximately 315° to increase the shear strength of the pad, the angles being relative to a shear force applied in a direction perpendicular to an edge of the substrate.

29. The integrated circuit die, as set forth in claim 24, wherein the second surface of the substrate comprises four corner landpads, each corner landpad having a conductive trace extending therefrom at an angle of approximately 180°, a conductive trace extending therefrom at an angle of approximately 90°, and a conductive trace extending therefrom at an angle of approximately 315° to increase the shear strength of the pad, the angles beig relative to a shear force applied in a direction perpendicular to an edge of the substrate.

30. A substrate comprising a first surface and a second surface, the second surface having an array of landpads, the array comprising four corner landpads, each of the four corner landpads having one or more conductive traces extending planarly therefrom and configured to increase the shear strength of the pad.

31. The substrate, as set forth in claim 30, wherein the substrate comprises a slot.

32. The substrate, as set forth in claim 30, wherein the integrated circuit die is mounted on the substrate in a board-on-chip fashion.

33. The substrate, as set forth in claim 30, wherein the second surface of the substrate comprises four corner landpads, each corner landpad having a conductive trace extending therefrom at an angle of approximately 180° and a conductive trace extending therefrom at an angle of approximately 315° to increase the shear strength of the pad, the angles being relative to a shear force applied in a direction perpendicular to an edge of the substrate.

34. The substrate, as set forth in claim 30, wherein the second surface of the substrate comprises four corner landpads, each corner landpad having a conductive trace extending therefrom at an angle of approximately 180°, a conductive trace extending therefrom at an angle of approximately 90°, and a conductive trace extending therefrom at an angle of approximately 315° to increase the shear strength of the pad, the angles beig relative to a shear force applied in a direction perpendicular to an edge of the substrate.

35. A substrate comprising a first surface and a second surface, the second surface having an array of landpads and four out-rigger pads, each of the out-rigger pads having one or more conductive traces extending planarly therefrom and configured to increase the shear strength of the pad.

36. The substrate, as set forth in claim 35, wherein the second surface of the substrate comprises four out-rigger pads, each out-rigger pad having a conductive trace extending therefrom at an angle of approximately 180° and a conductive trace extending therefrom at an angle of approximately 315° to increase the shear strength of the pad, the angles being relative to a shear force applied in a direction perpendicular to an edge of the substrate.

37. The substrate, as set forth in claim 35, wherein the second surface of the substrate comprises four out-rigger pads, each out-rigger pad having a conductive trace extending therefrom at an angle of approximately 180°, a conductive trace extending therefrom at an angle of approximately 90°, and a conductive trace extending therefrom at an angle of approximately 315° to increase the shear strength of the pad, the angles beig relative to a shear force applied in a direction perpendicular to an edge of the substrate.

38. An integrated circuit package comprising:
   a substrate comprising a first surface, wherein the first surface comprises a plurality of pads configured to receive a conductive connection and wherein at least one of the plurality of pads has one or more terminated traces extending therefrom; and
   integrated circuit die coupled to a second surface of the substrate.

39. The integrated circuit package, as set forth in claim 38, wherein the plurality of pads comprise corner pads each having one or more terminated traces extending therefrom.

40. The integrated circuit package, as set forth in claim 39, wherein each of the corner pads has a first terminated trace extending therefrom, each first terminated trace being perpendicular to each of a first and second peripheral edge of the substrate.

41. The integrated circuit package, as set forth in claim 40, wherein each of the corner pads has a second terminated trace extending therefrom, each second terminated trace being perpendicular to each of a third and fourth peripheral edge of the substrate.

42. The integrated circuit package, as set forth in claim 39, wherein the integrated circuit die comprises a memory device.

43. A substrate comprising a first surface, wherein the first surface comprises a plurality of pads, each configured to receive a conductive connection and wherein at least one of the pads has one or more terminated traces extending therefrom.

44. The substrate, as set forth in claim 43, wherein the plurality of pads comprise corner pads each having one or more terminated traces extending therefrom.

45. The substrate, as set forth in claim 44, wherein each of the corner pads has a first terminated trace extending therefrom, each first terminated trace being perpendicular to each of a first and second peripheral edge of the substrate.

46. The substrate, as set forth in claim 45, wherein each of the corner pads has a second terminated trace extending therefrom, each second terminated trace being perpendicular to each of a third and fourth peripheral edge of the substrate.

* * * * *